(12) United States Patent
Chen et al.

(10) Patent No.: US 7,781,800 B2
(45) Date of Patent: Aug. 24, 2010

(54) EMBEDDED SILICON GERMANIUM USING A DOUBLE BURIED OXIDE SILICON-ON-INSULATOR WAFER

(75) Inventors: Huajie Chen, Danbury, CT (US); Dureseti Chidambarrao, Weston, CT (US); Dominic J. Schepis, Wappingers Falls, NY (US); Henry K. Utomo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/169,674

(22) Filed: Jul. 9, 2008

(65) Prior Publication Data
US 2008/0265281 A1    Oct. 30, 2008

Related U.S. Application Data

(63) Continuation of application No. 10/908,394, filed on May 10, 2005, now Pat. No. 7,446,350.

(51) Int. Cl.
*H01L 21/8238* (2006.01)

(52) U.S. Cl. .................. 257/190; 257/192; 257/347; 257/E29.297; 257/E29.299; 257/E21.619

(58) Field of Classification Search .................. 257/190, 257/192, 347, E29.297, E29.299, E21.619; 438/151, 285
See application file for complete search history.

(56) References Cited

U.S. PATENT DOCUMENTS

| | | | |
|---|---|---|---|
| 5,268,324 A | 12/1993 | Aitken et al. | |
| 5,583,059 A | 12/1996 | Burghartz | |
| 5,882,987 A | 3/1999 | Srikrishnan | |
| 6,121,100 A | 9/2000 | Andideh et al. | |
| 6,365,488 B1 | 4/2002 | Liao | |
| 6,432,754 B1 | 8/2002 | Assaderaghi et al. | |
| 6,621,131 B2 | 9/2003 | Murthy et al. | |
| 6,855,982 B1 | 2/2005 | Xiang et al. | |
| 6,891,192 B2 | 5/2005 | Chen et al. | |
| 6,906,360 B2 | 6/2005 | Chen et al. | |
| 6,930,030 B2 | 8/2005 | Rausch et al. | |
| 7,067,868 B2 * | 6/2006 | Thean et al. | 257/296 |

(Continued)

OTHER PUBLICATIONS

Thompson, S.E., et al., "A Logic Nanotechnology Featuring Strained-Silicon", IEEE Electron Device Letters, vol. 25, No. 4, Apr. 2004, pp. 191-193.*

(Continued)

*Primary Examiner*—George Fourson
(74) *Attorney, Agent, or Firm*—Gibb I.P. Law Firm, LLC

(57) ABSTRACT

Disclosed is a p-type field effect transistor (pFET) structure and method of forming the pFET. The pFET comprises embedded silicon germanium in the source/drain regions to increase longitudinal stress on the p-channel and, thereby, enhance transistor performance. Increased stress is achieved by increasing the depth of the source/drain regions and, thereby, the volume of the embedded silicon germanium. The greater depth (e.g., up to 100 nm) of the stressed silicon germanium source/drain regions is achieved by using a double BOX SOI wafer. Trenches are etched through a first silicon layer and first buried oxide layer and then the stressed silicon germanium is epitaxially grown from a second silicon layer. A second buried oxide layer isolates the pFET.

17 Claims, 8 Drawing Sheets

U.S. PATENT DOCUMENTS

| | | |
|---|---|---|
| 7,102,201 B2 | 9/2006 | Furukawa et al. |
| 7,135,724 B2 | 11/2006 | Chen et al. |
| 7,176,481 B2 | 2/2007 | Chen et al. |
| 7,176,522 B2 | 2/2007 | Cheng et al. |
| 7,195,969 B2 * | 3/2007 | Chan et al. ................ 438/230 |
| 7,221,006 B2 | 5/2007 | Orlowski et al. |
| 7,282,415 B2 * | 10/2007 | Zhang et al. ................ 438/300 |
| 7,288,448 B2 | 10/2007 | Orlowski et al. |
| 7,306,997 B2 | 12/2007 | Xiang et al. |
| 7,323,391 B2 * | 1/2008 | Arghavani ................ 438/285 |
| 2003/0057439 A1 | 3/2003 | Fitzgerald |
| 2005/0029601 A1 | 2/2005 | Chen et al. |
| 2005/0082531 A1 | 4/2005 | Rim |
| 2005/0093084 A1 | 5/2005 | Wang et al. |
| 2005/0130454 A1 | 6/2005 | Murthy et al. |
| 2005/0285192 A1 | 12/2005 | Zhu |
| 2006/0056968 A1 | 3/2006 | Jacala et al. |
| 2006/0065914 A1 | 3/2006 | Chen et al. |
| 2006/0166492 A1 | 7/2006 | Orlowski et al. |
| 2006/0231892 A1 | 10/2006 | Furukawa et al. |

OTHER PUBLICATIONS

Chidambaram, P.R., et al., "35% Drive Current Improvement from Recessed-SiGe Drain Extensions on 37 nm Gate Length PMOS", 2004 Symposium on VLSI Technology Digest of Technical Papers, 2004, pp. 48-49.*

* cited by examiner

EMBEDDED SILICON GERMANIUM USING A DOUBLE BURIED OXIDE SILICON-ON-INSULATOR WAFER

CROSS-REFERENCE TO RELATED APPLICATIONS

This application is a continuation of U.S. application Ser. No. 10/908,394 filed May 10, 2005.

BACKGROUND OF THE INVENTION

1. Field of the Invention

The invention generally relates to a p-type field effect transistor and a method of forming the transistor using a double buried oxide silicon-on-insulator wafer that allows for a thick growth of strained silicon germanium in the source/drain regions to create longitudinal stress on the channel region.

2. Description of the Related Art

U.S. Pat. No. 6,621,131 to Murthy (hereinafter "Murthy") discloses embodiments that were satisfactory for the purposes for which they were intended. The disclosure of Murthy, in its entirety, is hereby expressly incorporated by reference into the present invention for purposes including, but not limited to, indicating the background of the present invention and illustrating the state of the art. It has been shown that the strain in the silicon channel can affect the mobility of complimentary metal oxide semiconductor (CMOS) transistor carriers significantly. Compressive longitudinal stress along the channel is known to help the PFET (P-type field effect transistor) drive current while it degrades the NFET (N-type field effect transistor) performance. There have been many proposals to improve both NFET and PFET device performance using tensile and compressive longitudinal stresses, respectively, which include modulating middle of line (MOL) nitride liner and spacer intrinsic stresses and STI (shallow trench isolation) material changes individually for the two MOSFETs (metal oxide semiconductor field effect transistors) using masks. The stress state in the channel that can be imposed by any of these approaches is typically a few hundred MPa.

Another approach is to use silicon germanium based strained silicon substrates, where silicon germanium is used as part of the whole substrate. When silicon (Si) is grown epitaxially on the "relaxed" silicon germanium layer, a tensile strain results in the Si and thereby improves electron mobility. However, this technique requires silicon germanium to be relaxed, which demands a very thick silicon germanium layer (i.e., 0.5-1 micron) in bulk systems. In bulk systems silicon germanium relaxes through the formation of a dense network of misfit dislocations. These dislocations are known to cause a major yield issue. Hole mobility is even more difficult to enhance in this approach since we need a very large germanium percentage in the relaxed silicon germanium film which causes an even bigger yield and dislocation problem. In silicon germanium-on-insulator (SGOI) systems the germanium is grown on a silicon-on-insulator (SOI) wafer and is then thermally mixed with the silicon to give a "relaxed" silicon germanium on a buried oxide (BOX) substrate. On this silicon germanium on insulator, Si is epitaxially grown to get a tensile film. Unfortunately, in the SGOI system, as the silicon germanium relaxes, dislocations (and in addition, stacking faults) form with concomitant yield degradation. Further, the cost of the process is also prohibitive. Some techniques such as graded germanium concentration and chemical mechanical polishing (CMP) are used to improve the quality of the films, but in general, this process is plagued by a high density of defects and prohibitive costs.

SUMMARY OF THE INVENTION

The invention presents a p-type field effect transistor structure and the method of forming the structure. The p-type field effect transistor is formed using a double buried oxide (BOX) silicon-on-insulator (SOI) substrate. The double BOX SOI substrate comprises a first silicon layer, a first buried oxide layer below the first silicon layer, a second silicon layer below the first buried oxide layer, and a second buried oxide layer on a substrate below the second silicon layer. Specifically, the p-type field effect transistor comprises a gate stack on an n-doped portion of the first silicon layer. P-doped source/drain regions are located adjacent to the gate stack and delimit a p-channel region directly below the gate stack. The source/drain regions comprise strained silicon germanium and extend through the n-doped portion of the first silicon layer and through the first buried oxide layer to the second silicon layer. The strained silicon germanium of the source/drain regions imposes a longitudinal stress on the channel region. The silicon germanium of the source/drain regions may also extend above a top surface of the wafer to further increase the longitudinal stress placed upon the channel region. The second buried oxide layer below the second silicon layer isolates the transistor and increases the longitudinal stress imposed upon the channel region. The concentration of germanium in the strained silicon germanium is between about 10% and 50%. The strained silicon germanium is in-situ doped with boron or other similar impurity so that the source/drain regions comprise the p-doped silicon necessary for a p-type field effect transistor. The longitudinal stress imposed upon the channel region by the strained silicon germanium can be greater than approximately 350 megapascals (MPa).

In another embodiment the structure comprises the same p-type field effect transistor described above formed on the same wafer adjacent to an n-type field effect transistor. The n-type field effect transistor comprises a gate stack on a p-doped portion of the first silicon layer. N-doped source/drain regions are located within the p-doped portion adjacent to the gate stack and delimit an n-channel region directly below the gate stack. An isolation region is located between the p-type field effect transistor and the n-type field effect transistor and extends to the second buried oxide layer to isolate the p-type field effect transistor from the n-type field effect transistor.

A method of forming a p-type field effect transistor of the present invention comprises providing a double BOX SOI wafer. An n-doped portion is formed in the first silicon layer and a gate stack for the p-type field effect transistor is formed on the n-doped portion. Temporary sidewall spacers are formed on the gate stack. Trenches are then lithographically patterned into the wafer on either side of the sidewall spacers on the gate stack. The trenches are then etched through to the second silicon layer by first selectively etching a recess in the first silicon layer to expose the first buried oxide layer. Then, another recess is selectively etched through the first buried oxide layer to expose the second silicon layer. Strained silicon germanium is formed in the trenches in order to impose a longitudinal stress on a channel region in the first silicon layer between the trenches. The strained silicon germanium can be formed in the trenches by epitaxially growing the strained silicon germanium from the second silicon layer exposed when the trenches were formed. The strained silicon germanium may be grown above a top surface of wafer in order to further increase the longitudinal stress on the channel region.

The strained silicon germanium may also be in situ doped with boron during the epitaxial growth process so that the source/drain regions comprise the necessary p-doped silicon for a p-type field effect transistor. The temporary sidewall spacers are removed and additional processing continues until the p-type field effect transistor is completed (e.g., source/drain extension implantation, permanent sidewall spacers formation on the gate stack, silicide formation on the source/drain regions and the gate stack, implantation anneal, etc.)

A method of forming both the p-type field effect transistor of the invention and an n-type field effect transistor on the same wafer also comprises first providing a double BOX SOI wafer. An n-doped silicon portion for a p-type field effect transistor and a p-doped silicon portion for an n-type field effect transistor are both formed in a first silicon layer of the wafer. Isolation structures are formed in the wafer between the p-type field effect transistor region and the n-type field effect transistor region. The isolations structures extend to the second buried oxide layer and will isolate the p-type field effect transistor from the n-type field effect transistor. Corresponding gate stacks (e.g., first gate stack and second gate stack) are formed on the n-doped silicon portion for the p-type field effect transistor and the p-doped silicon portion for the n-type field effect transistor. The n-type field effect transistor region is masked and temporary sidewall spacers are formed on the first gate stack. Trenches are lithographically patterned onto the wafer on either side of the sidewall spacers on the first gate stack. The trenches are then etched through to the second silicon layer by first selectively etching a recess in the first silicon layer to expose the first buried oxide layer. Then, another recess is selectively etched through the first buried oxide layer to expose the second silicon layer. Strained silicon germanium is formed in the trenches in order to impose a longitudinal stress on a channel region in the first silicon layer between the trenches. The strained silicon germanium can be formed in the trenches by epitaxially growing the strained silicon germanium from the second silicon layer exposed when the trenches were formed. The strained silicon germanium may be grown above a top surface of the first silicon layer in order to further increase the longitudinal stress on the channel region. The strained silicon germanium may also be in situ doped with boron during the epitaxial growth process so that the source/drain regions comprise the necessary p-doped silicon for a p-type field effect transistor. The temporary sidewall spacers are removed and additional processing continues until the p-type field effect transistor is completed. For example, the source/drain extensions for the p-type field effect transistor may be implanted. After the source/drain extensions for the p-type field effect transistor are implanted, the n-type field effect transistor region may be unmasked and the p-type field effect transistor region masked so that the source drain regions and extensions for the n-type field effect transistor may be implanted. Implantation of the source/drain regions and extensions may be followed by gate stack sidewall spacer formation and silicide formation. These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
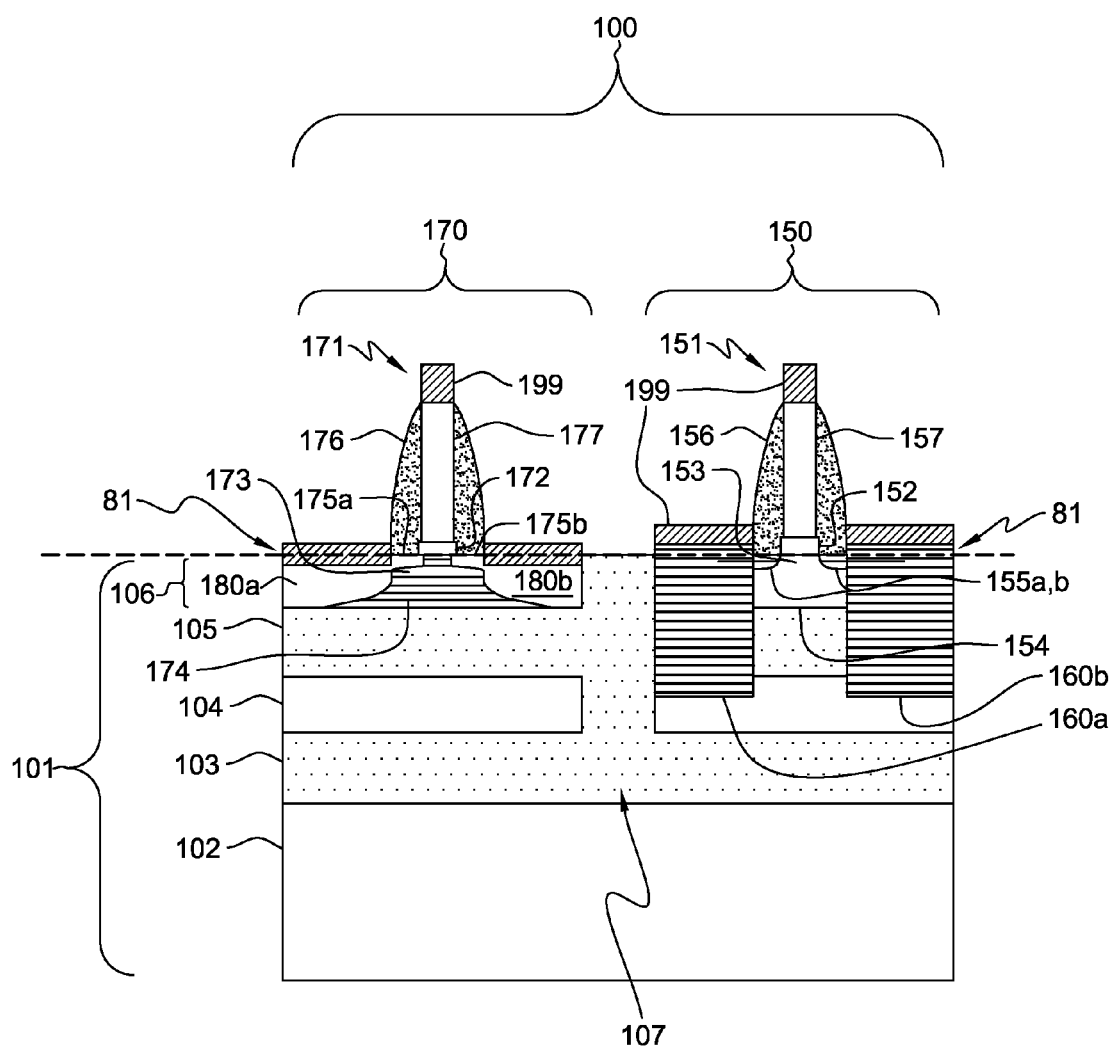
FIG. 1 is a schematic illustration of an embodiment of the structure of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, strain in the silicon channel can affect the mobility of CMOS transistor carriers significantly. Compressive longitudinal stress along the channel is known to help the pFET (P-type field effect transistor) drive current. Embedded silicon germanium in the source/drain regions for pFETs is known to enhance pFET performance. Specifically, silicon germanium grown epitaxially on Si in the source/drain regions of a pFET aligns itself to the Si and causes severe compression in itself and thereby causes large longitudinal compression in the channel just under the gate. This large longitudinal compression in the channel enhances mobility for the pFET. One way to increase the amount of stress is by increasing the volume of embedded silicon germanium in the source/drain regions. The silicon thickness in a single BOX SOI wafer limits the available thickness for embedding silicon germanium. Lastly, silicon germanium on the source/drain regions of a pFET above the wafer slightly increases stress but do not significantly enhance yield. The present invention provides a structure and method for enhancing the stress along the channel by increasing the volume of the embedded silicon germanium in the source/drain regions of the pFET. For the same percentage germanium, width and length, a larger volume can be obtained by etching deeper into the substrate.

Referring to FIG. 1, in one embodiment the invention presents a p-type field effect transistor structure 150. The p-type field effect transistor structure 150 is formed using a double buried oxide (BOX) silicon-on-insulator (SOI) substrate 101. The double BOX SOI substrate 101 comprises a first silicon layer 106, a first buried oxide layer 105 below the first silicon layer 106, a second silicon layer 104 below the first buried oxide layer 105, and a second buried oxide layer 103 on a substrate 102 below the second silicon layer 104. Specifically, the p-type field effect transistor 150 comprises a gate stack 151 on an n-doped portion 154 of the first silicon layer 106. The gate stack 151 comprises a gate dielectric 152 below a gate conductor 157. A silicide 199 may be formed on the gate conductor 157. P-doped source/drain regions 160a, 160b as well as their corresponding p-doped source/drain extensions 155a, 155b are located adjacent to the gate stack 151. A top thin layer of the n-doped portion 154 directly below the gate stack 151 between the source/drain extensions 155a, 155b forms the channel region 153. The source/drain regions 160a-160b comprise strained silicon germanium and extend through the n-doped portion 154 of the first silicon layer 106 and through the first buried oxide layer 105 to the second silicon layer 104. The strained silicon germanium of the source/drain regions 160a, 160b imposes a longitudinal stress on the channel region 153. The silicon germanium of the source/drain regions 160a, 160b may also extend above a top surface 81 of the wafer 101 to further increase the longitudinal stress placed upon the channel region. The thickness of the stress silicon germanium source/drain regions 160a, 160b can be approximately 10 nm to 100 nm thick and is preferably between 20 nm and 30 nm thick. The second buried oxide layer 103 below the second silicon layer 104 isolates the transistor and increases the longitudinal stress imposed upon the channel region 153. The concentration of germanium in the strained silicon germanium of the source/drain regions 160a-160b is between about 10% and 50%. The strained silicon germanium is in-situ doped with boron or other similar impurity so that the source/drain regions comprise the p-doped silicon necessary for a p-type field effect transistor 150. The longitudinal stress imposed upon the channel region by the strained silicon germanium can be greater than approximately 350 megapascals (MPa).

Figure 2:
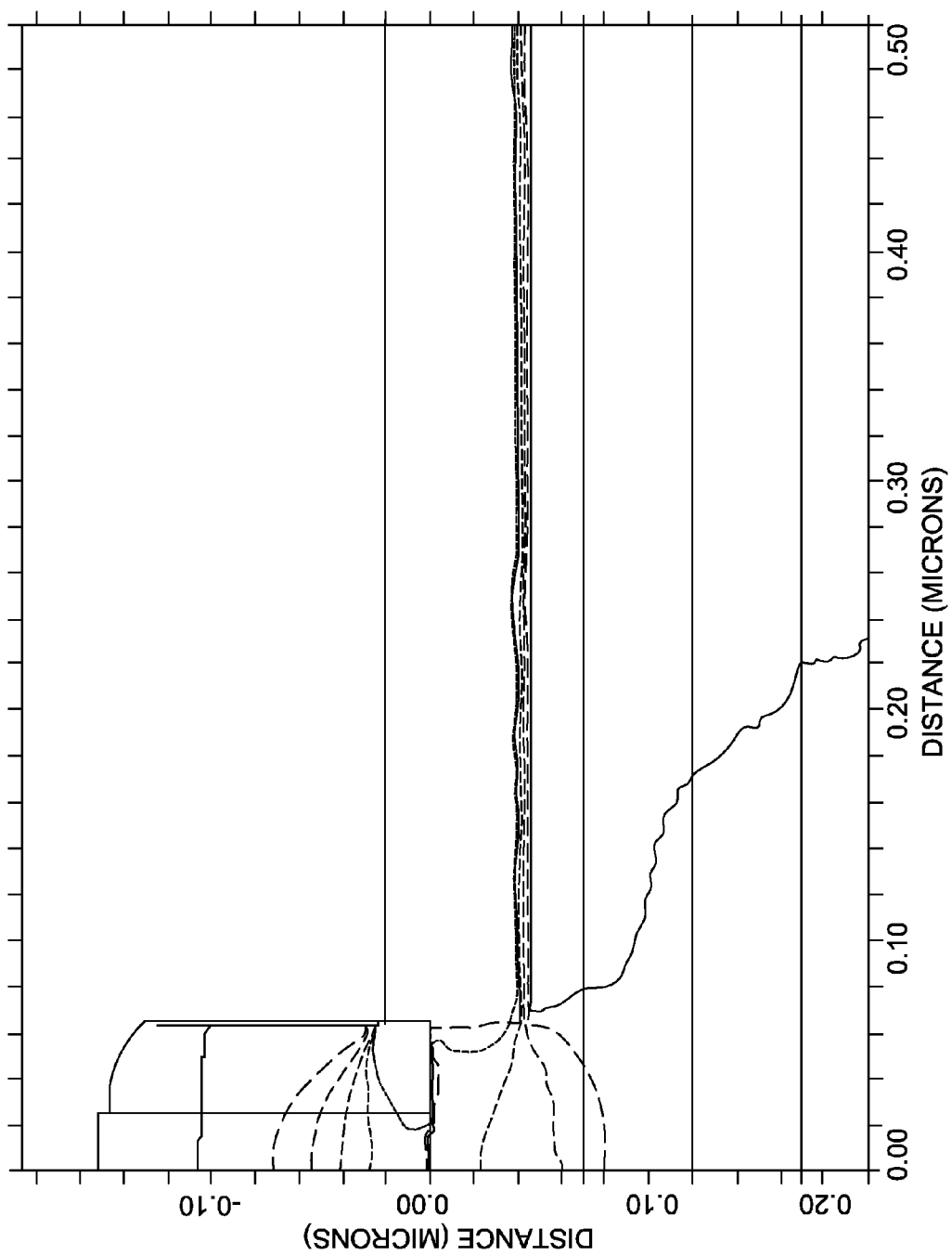
FIG. 2 is a schematic graph illustrating stresses in eSiGe with SOI wafer.
Figure 3:
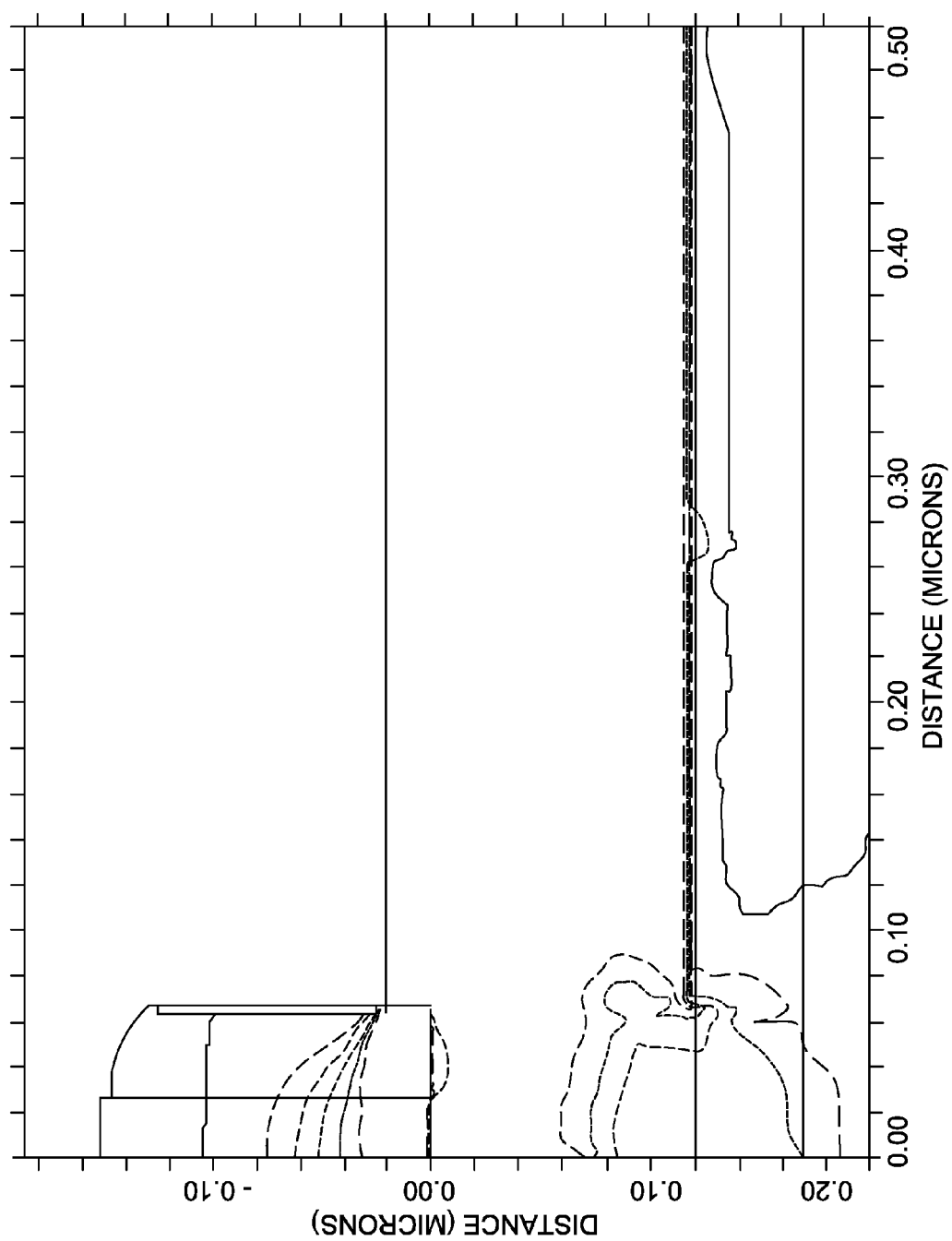
FIG. 3 is a schematic graph illustrating stresses in eSiGe with double BOX SOI wafer.

Using two layers of insulators in SOI technology (double BOX SOI 101) higher strain can be obtained by being able to recess deeper into the substrate 101. FIG. 2 is a graph illustrating the stresses in epitaxially grown silicon germanium in the source/drain regions of a p-type field effect transistor formed using a single buried oxide silicon-on-insulator wafer. FIG. 3 is a similar graph illustrating the stresses in epitaxially grown silicon germanium in the source/drain regions of a p-type field effect transistor 150 of the present invention formed using a double buried oxide (BOX) silicon-on-insulator (SOI) wafer 101. The double BOX SOI wafer 101 allows the source/drain regions 160a, 160b to be thicker than a conventional single BOX SOI wafer. Thickening the source/drain regions 160a, 160b increase the volume of the stressed silicon germanium and thus the stress on the p-channel 153. The stress simulations shown in FIGS. 2 and 3 illustrate the dramatic increase in stress for the double BOX SOI over the single BOX SOI. The stress levels are in the 600 megapascals (MPa) range for the double BOX SOI over the typical 300 MPa range for the single BOX SOI. This is a 100% increase in stress. Thus, instead of the 15% yield gains that can be observed if the source/drain regions of p-type field effect transistors are formed with epitaxially grown silicon germanium in a single BOX SOI, another 15% yield gain for a total of 30% enhancements can be observed using the p-type field effect transistor of the present invention. This enhancement is derived from the double BOX layers 103 and 105. While, using bulk epitaxially grown silicon germanium may allow the source/drain regions of a p-type field effect transistor to be as thick, the yield gains for the present invention are better than those observed using bulk epitaxially grown silicon germanium because a larger stress transfer occurs to the upper channel region since the first BOX layer 105 is more pliant. This larger stress transfer also makes the stress in the channel a lot more uniform.

Again referring to FIG. 1, in another embodiment a transistor structure 100 comprises the same p-type field effect transistor 150, described above, in combination with an n-type field effect transistor 170. The n-type field effect transistor comprises a gate stack (i.e., second gate stack 171) on a p-doped portion 174 of the first silicon layer 106. N-doped source/drain regions 180a, 180b, as well as n-doped source drain extensions 175a, 175b are located within the p-doped portion 174 adjacent to the second gate stack 171. A top thin layer of the p-doped portion 174 between the source/drain extensions 175a, 175b and directly below the second gate stack 171 forms the n-channel region 173. An isolation region 107 is located between the p-type field effect transistor 150 and the n-type field effect transistor 170. The isolation region 107 extends to the second buried oxide layer 103 and thereby isolates the p-type field effect transistor 150 from the n-type field effect transistor 170.

Figure 4:
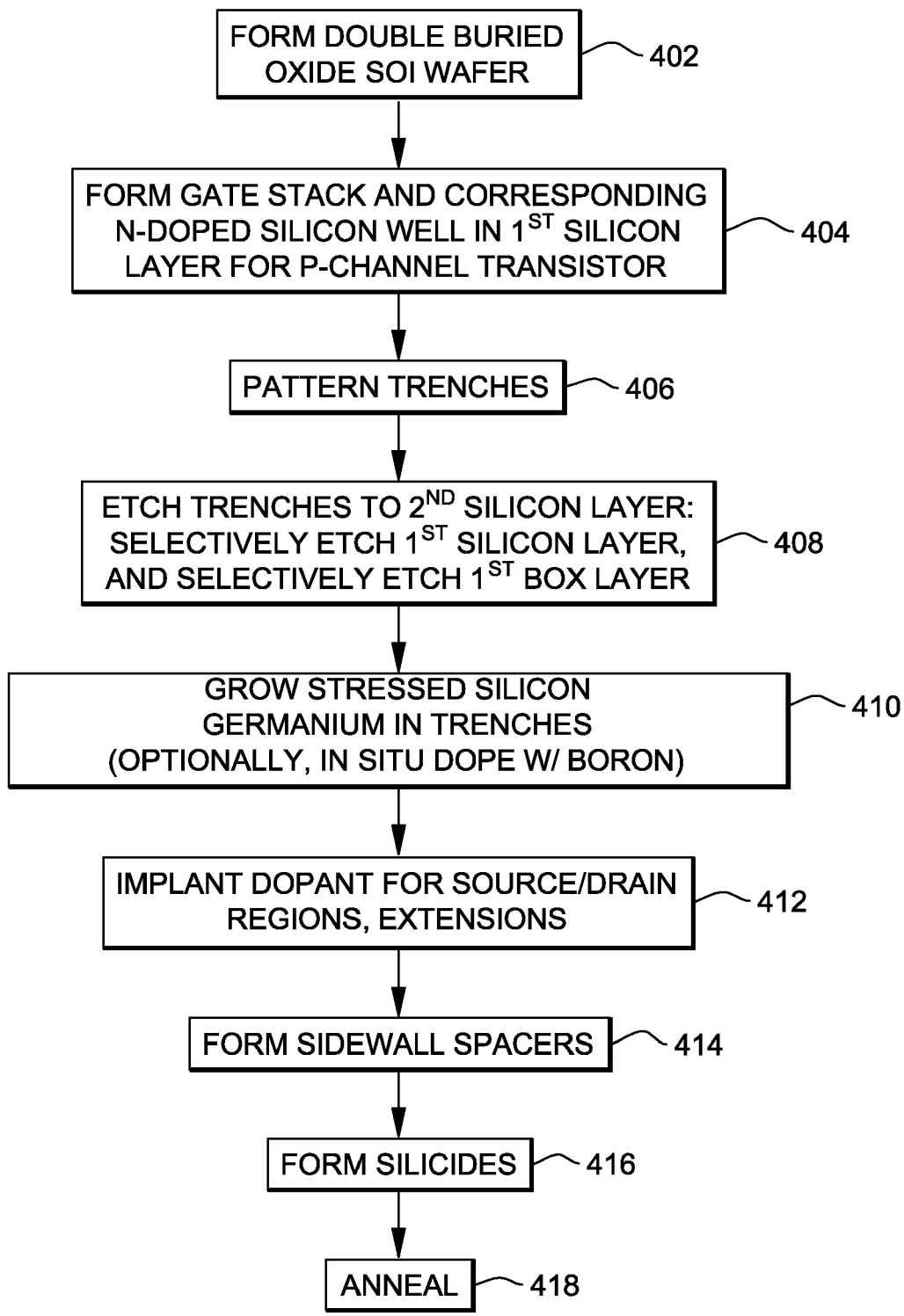
FIG. 4 is a schematic flow diagram of an embodiment of the method of the invention.
Figure 6:
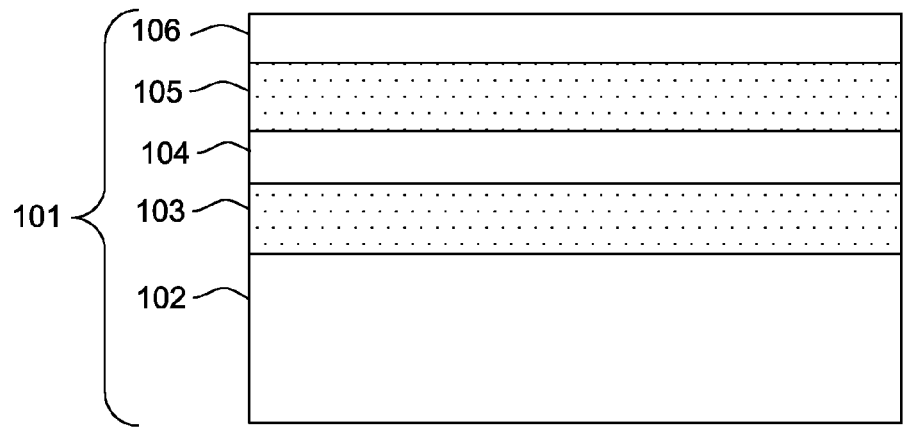
FIG. 6 is a schematic illustration of a partially completed structure of the invention.

Referring to FIG. 4, a method of forming a p-type field effect transistor 150 of the present invention comprises providing a double BOX SOI wafer (402, see FIG. 6). The double BOX SOI wafer 101 comprises a first silicon layer 106, a first buried oxide layer 105 below the first silicon layer 106, a second silicon layer 104 below the first buried oxide layer 105, and a second buried oxide layer 103 on a substrate 102 below the second silicon layer 104. The double BOX SOI wafer 101 of the present invention may be fabricated by various known techniques such as by a Unibond "Smart Cut"™ method, a bond and etch-back silicon-on-insulator (BESOI) method, or a separation by implantation of oxygen (SIMOX) method. These methods are described in U.S. Pat. No. 5,882,987 to Srikrishhnan issued on Mar. 3, 1999 and U.S. Pat. No. 6,365,488 to Liao issued on Apr. 2, 2002, both of which are incorporated herein by reference. Both the Smart Cut™ method and the BESOI methods form the structures by bonding two silicon-on-insulator (SOI) wafers together. Alternatively, the second insulator layer 103 can be implanted through the first insulator layer 105 of a single BOX SOI wafer, as described in U.S. Pat. No. 6,432,754 to Assaderaghi et al. issued on Aug. 13, 2002. The thickness of the buried oxide layers 103, 105 and the silicon layers 106, 104 is substrate and technology dependent and, thus, so is the depth of the stressed silicon germanium source/drain regions 160a, 160b (see discussion below).

Figure 7:
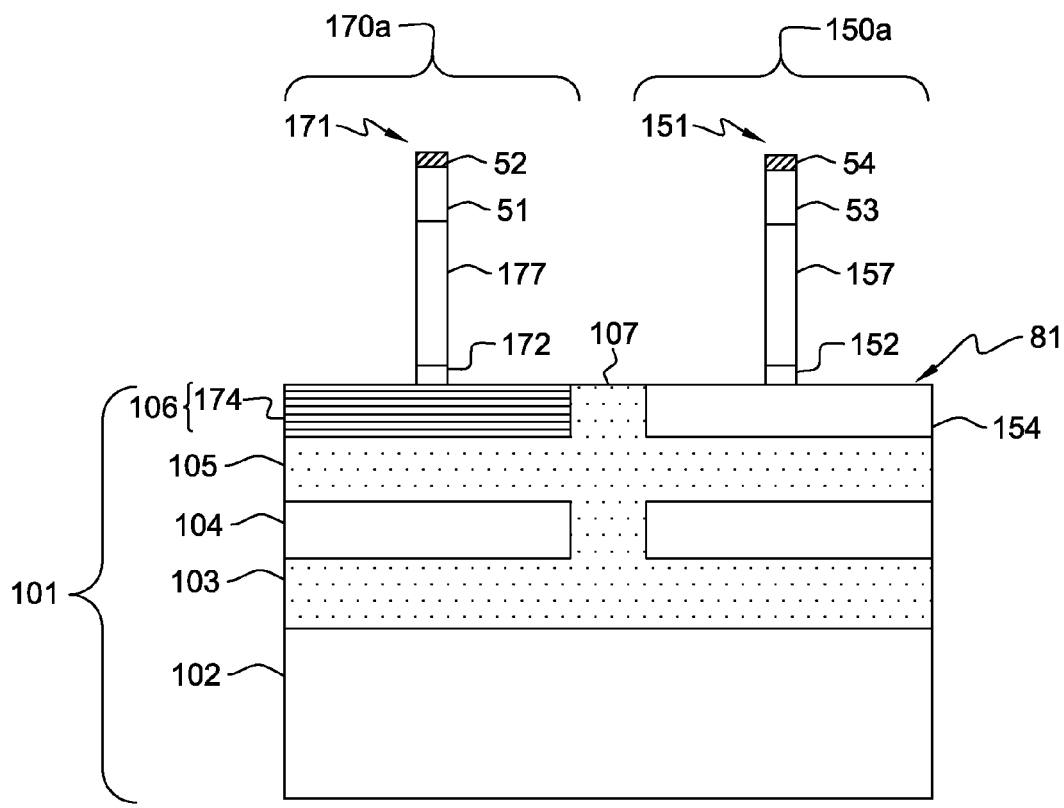
FIG. 7 is a schematic illustration of a partially completed structure of the invention.
Figure 8:
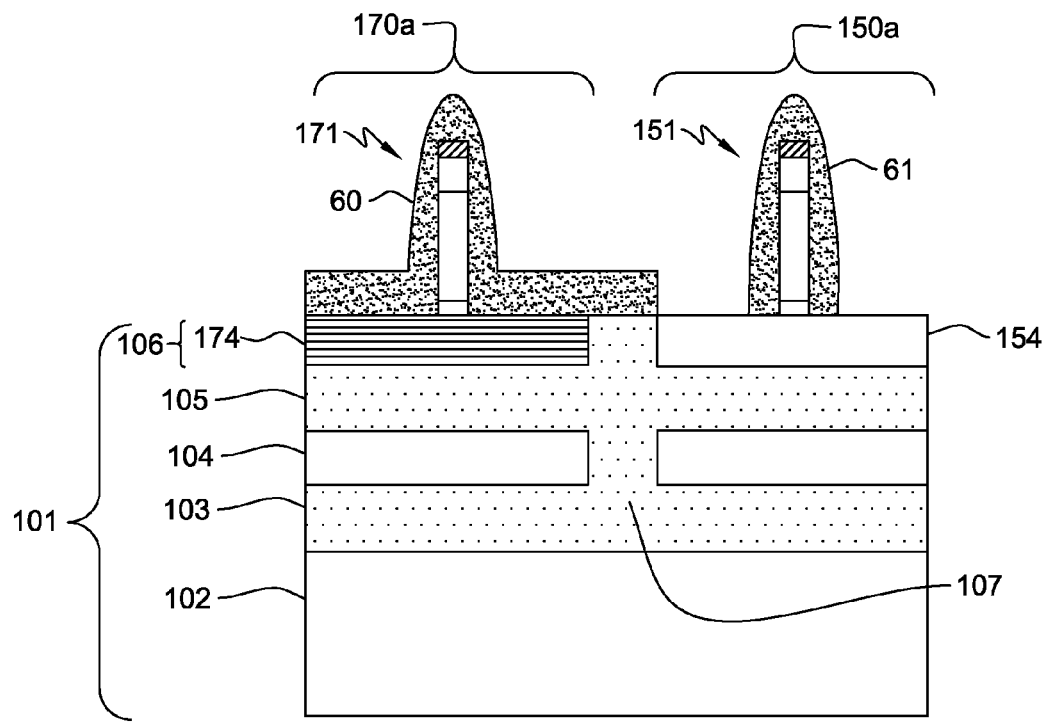
FIG. 8 is a schematic illustration of a partially completed structure of the invention.

Still referring to FIG. 4, an n-doped portion 154 (e.g., doped with an n-type dopant such as phosphorus, arsenic, or antimony) is formed in the first silicon layer 106 and a gate stack 151 for a p-type field effect transistor 150 is formed on the n-doped portion 154 (404, see FIG. 7). The gate stack 151 may be formed using well-known processing steps. The gate stack 151 may be formed to comprise a gate dielectric 152, a gate conductor 157 on the gate dielectric 152, a p-FET pre-dopant 53 in the top portion of the gate conductor 157 and an insulator 54 on the gate conductor 157. Temporary sidewall spacers 61 are formed over the gate stack 151 (see FIG. 8).

Figure 9:
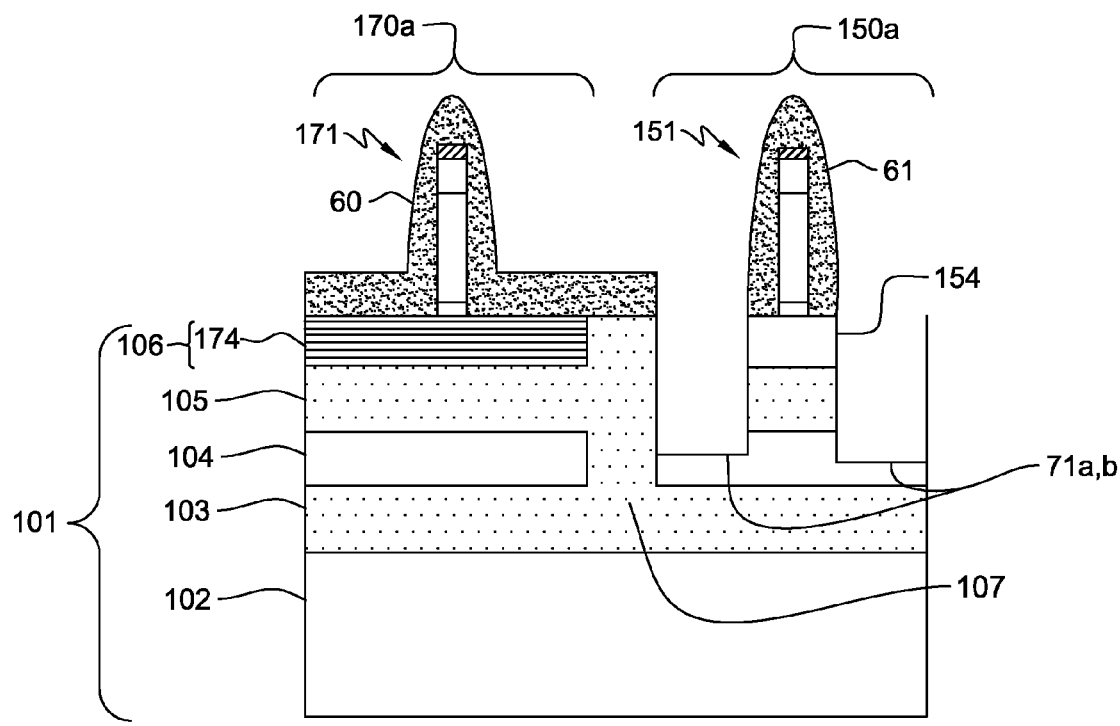
FIG. 9 is a schematic illustration of a partially completed structure of the invention.

Trenches are then lithographically patterned into the wafer 101 on either side of the sidewall spacers 61 (406). The trenches 71a, 71b are then etched through the wafer 101 to the second silicon layer 104 (408, see FIG. 9). By using the double BOX SOI wafer 101, recess etching at process 408 can be performed using two steps that allows for better control. First, a recess may be selectively etched (e.g., by reactive ion etching) through the first silicon layer 106 using the first buried oxide layer 105 as a stopping layer. Then, another recess can be selectively etched (e.g., by reactive ion etching) through the first buried oxide layer 105 using the second silicon layer 104 as a stopping layer.

Figure 10:
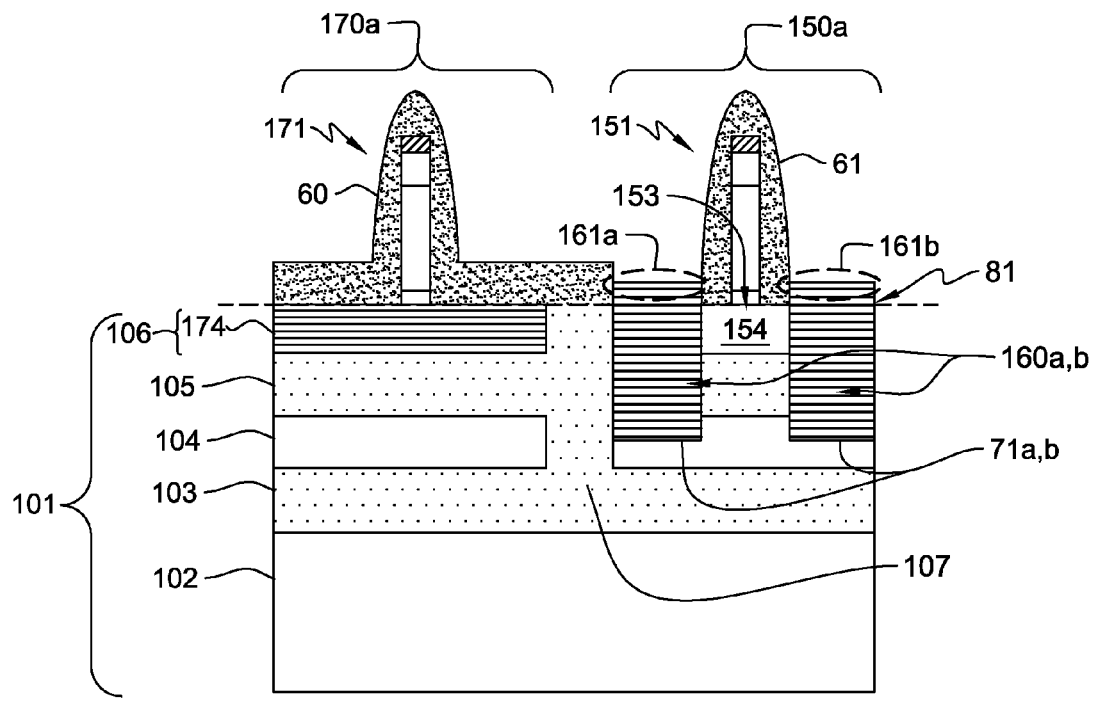
FIG. 10 is a schematic illustration of a partially completed structure of the invention.

Strained silicon germanium is formed in the trenches 71a, 71b in order to form stressed silicon germanium source/drain regions 160a, 160b, in trenches 71a and 71b, respectively (410, see FIG. 10). Specifically, the strained silicon germanium can be formed in the trenches 71a, 71b by epitaxially growing the strained silicon germanium from the second silicon layer 104 exposed when the trenches 71a, 71b were formed at process 408. The stressed silicon germanium source/drain regions 160a, 160b are adapted to impose a longitudinal stress on a channel region 153 that will be formed in the top layer of the n-doped portion 154 between the trenches 71a, 71b. Instead of silicon germanium, any strain producing material whether now known or developed in the future can be used with the invention, and silicon germanium is only used as an example. This can be done in multiple steps or continuously. The silicon germanium source/drain regions 160a, 160b may be grown above a level a top surface 81 of the wafer 101 as indicated by the portions 161a, 161b of source/drain regions 160a, 160b. Growing the silicon germanium source/drain regions 160a, 160b above the top surface 81 of the wafer further increases the volume of the source/drain regions 160a, 160b and thereby increases the stress imposed upon the channel region 153. The process 410 of epitaxially growing the silicon germanium in FIG. 10 comprises a selective epitaxy process, which grows silicon germanium on the exposed silicon surface of the second silicon layer 104, but does not grow silicon germanium on dielectric layers, such as nitride or oxide. Also, this epitaxial process 410 can be done in the presence of an appropriate dopant impurity (such as in situ doping of boron), such that the silicon germanium grows with the dopant included therein, without there being a need to implant additional dopants later in subsequent processing. Instead of boron, any appropriate impurity whether now known or developed in the future can be used with the invention and boron is only used as an example herein. Therefore, the silicon germanium source/drain regions 160a, 160b are referred to as in-situ doped source/drain regions. The germanium concentration in the silicon germanium film can be 10-50%, and more precisely 15-30%. The boron doping level in the silicon germanium can be larger than $1 \times 10^{20}/cm^3$.

As is understood by those ordinarily skilled in the art, epitaxially grown silicon germanium is pseudomorphic to the silicon substrate and hence compressively strained, when the germanium concentration and thickness is chosen so that the film does not relax at the epitaxy temperature and subsequent process steps. This compressively strained silicon germanium in the extension and source/drain apply longitudinal stress to the channel region. As explained above, by straining the channel region 153, the performance of the p-type field effect transistor 150 is substantially improved. Further, increasing the depth of the trenches 71a, 71b greater than the thickness of a silicon layer of a single BOX SOI wafer by using a double BOX SOI 101, maximizes the stress that is applied to the channel region 153 and thereby maximizes the performance of the p-type field effect transistor 150.

Figure 11:
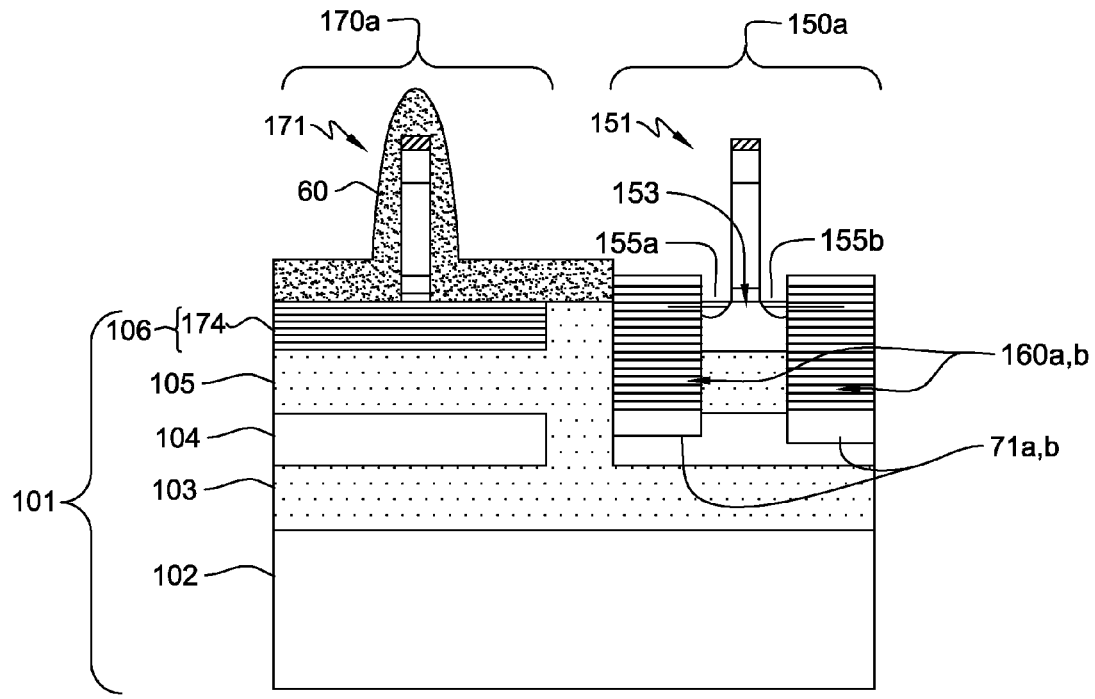
FIG. 11 is a schematic illustration of a partially completed structure of the invention.

Once the source/drain regions 160a, 160b are formed at process 410, the temporary sidewall spacers 61 may be removed (e.g., by an HF etch if the sidewall spacers 61 are an oxide) from the gate stack 151 and additional well-known processing steps can be performed until the p-type field effect transistor 150 is completed (see FIG. 1). For example, source/drain regions 160a, 160b dopant (e.g., boron) implantation (if in situ doping did not occur at process 410) and/or source/drain extensions 155a, 155b dopant (e.g., boron) implantation (412, see FIG. 11), permanent sidewall spacers 156 formation on the gate stack 151 (414), silicide 199 formation (416) on the source/drain regions 160a, 160b and the gate stack 151 (416), implantation anneal (418), forming metal contacts and interconnects, etc. (see FIG. 1).

Figure 5:
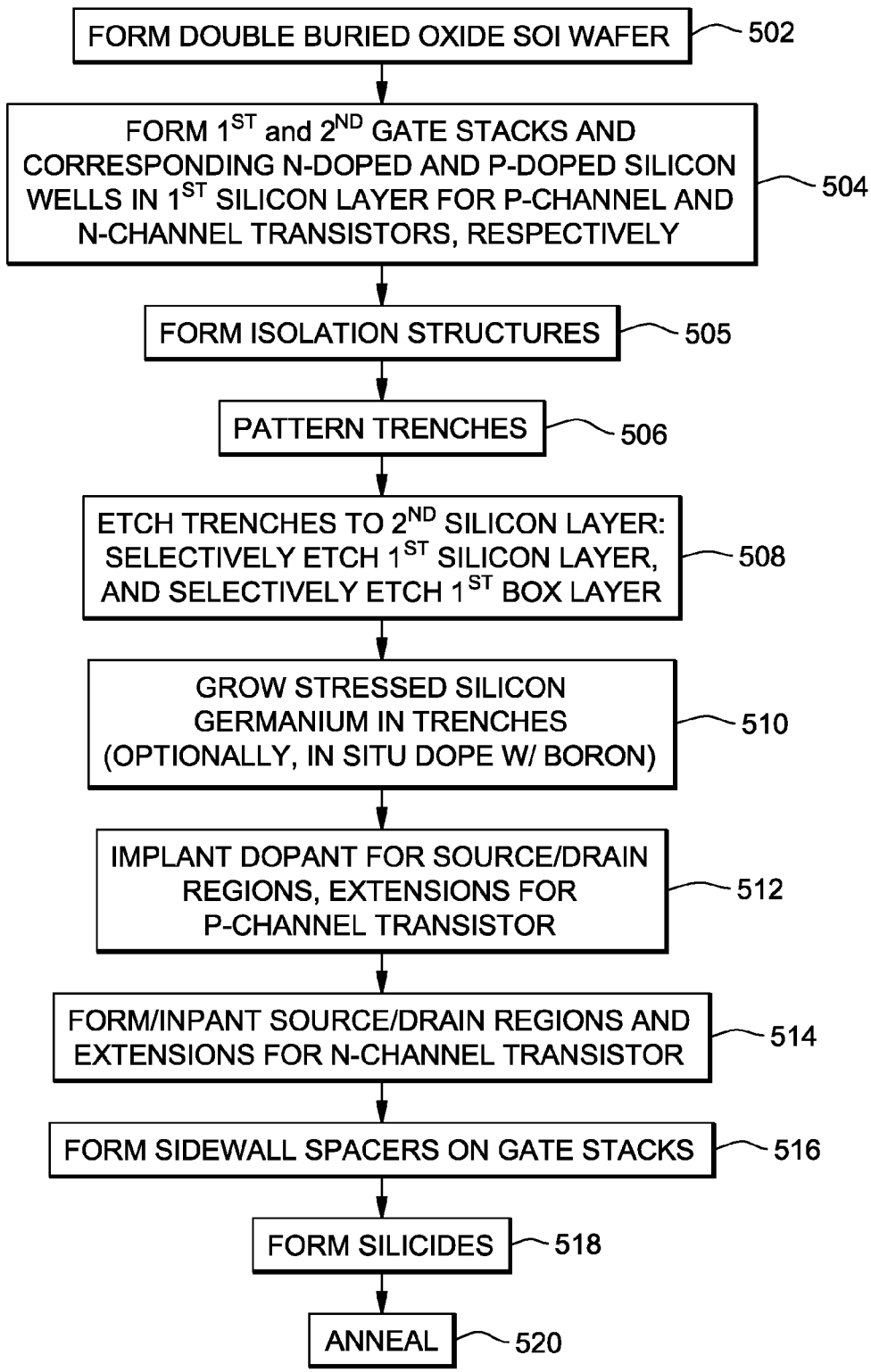
FIG. 5 is a schematic flow diagram of another embodiment of the method of the invention.

Referring to FIG. 5, another embodiment of the method of the invention is a method of forming both a p-type field effect transistor 150 and an n-type field effect transistor 170 to form a transistor structure 100 on the same wafer 101. The method comprises first providing a double BOX SOI wafer 101 (502, see FIG. 6 and discussion above). Using well-known processing steps, both an n-doped silicon portion 154 (e.g., doped with an n-type dopant such as phosphorus, antimony or arsenic) and corresponding first gate stack 151 for a p-type field effect transistor 150 and a p-doped silicon portion 174 (e.g., doped with a p-type dopant such as boron) and corresponding second gate stack 171 for an n-type field effect transistor 170 are formed in a first silicon layer 106 of the wafer 101 (504, see FIG. 7). The first gate stack 151 may be formed as described above. The second gate stack 171 may formed such that it comprises a gate dielectric 172, a gate conductor 177 on the gate dielectric 172, a n-FET pre-dopant 51 in the top portion of the gate conductor 177 and an insulator 52 on the gate conductor 177.

Isolation structures 107 are formed in the wafer 101 between the p-type field effect transistor region 150a and the n-type field effect transistor region 170a (505, see FIG. 7). The isolations structures 107 extend to the second buried oxide layer 103 and will isolate the p-type field effect transistor 150 from the n-type field effect transistor 170. The isolation structures 107 may be formed, for example, by lithographically patterning trenches, etching the trenches to the second buried oxide layer 103 and filling the trenches with an oxide.

The n-type field effect transistor region 170a as well as the isolation structures 107 can be masked (e.g., by mask 60) and temporary sidewall spacers 61 can be formed on the first gate stack 151. Trenches 71a, 71b for the source/drain regions 160a, 160b of the p-type field effect transistor are lithographically patterned onto the wafer 101 on either side of the sidewall spacers 61 on the first gate stack 151 (506). Then, the process of forming the p-type field effect transistor 150 proceeds, as described above. The trenches 71a, 71b are etched through to the second silicon layer 104 using a two step process (508, see FIG. 9 and discussion above). Strained silicon germanium is grown in the trenches 71a, 71b and in situ doped with boron to form strained silicon germanium source/drain regions 160a, 160b for the p-type field effect transistor 150 (510, see FIG. 10 and discussion above). Once the silicon germanium source/drain regions 160a, 160b are formed at process 510, the temporary sidewall spacers 61 on the first gate stack 151 are removed. Additional, well-known processing steps can be performed until both the p-type field effect transistor 150 and the n-type field effect transistor 170 is completed. For example, the source/drain regions 160a, 160b, if not already doped, and source/drain extensions 155a, 155b for the p-type field effect transistor 150 may be implanted with a p-type dopant (e.g., with boron) (512). After the source/drain extensions 155a, 155b for the p-type field effect transistor 150 are implanted at process 512, the n-type field effect transistor region 170a may be unmasked and the p-type field effect transistor region 150a masked so that the source/drain regions 180a, 180b and extensions 175a, 175b for the n-type field effect transistor 170 may be implanted with an n-type dopant (e.g., phosphorus, arsenic, antimony, etc.) (514, see FIG. 1). Implantation of the source/drain regions 180a, 180b and extensions 175a, 175b (514) may be followed by sidewall spacer 156, 176 formation on both the first and second gate stacks 151, 171 (516, see FIG. 1), silicide formation (518, see silicides 199 of FIG. 1), an implantation anneal (520), formation of metal contacts and interconnects, etc.

Thus, the p-type field effect transistor structure 150 alone, or as combined with an n-type field effect transistor 170 to form transistor structure 100, enhances the stress on the p-channel 153 by embedding silicon germanium into deep source/drain regions 160a, 160b of the p-type field effect transistor 150 (i.e., pFET). The greater depth (e.g., up to 100 nm) of the stressed silicon germanium source/drain regions 160a, 160b is achieved by using a double BOX SOI wafer 101. There are a number of advantages to using the double BOX SOI wafer 101 for the embedded silicon germanium application. Since nFET and pFET active regions are isolated by an extra buried oxide (2nd BOX layer) 103 (and an isolation region 107), there is an extra window to recess deeper to the second silicon layer 104. This will give an increase in volume to silicon germanium source/drain regions 1601, 160b and thus an increase in stress on the p-channel region 153. More uniform stress and higher stress, as well as other benefits of SOI technology, can be achieved by using a double BOX SOI wafer 101 as compared to a bulk silicon substrate for the same depth. Existing integration methods for creating intrinsic or in situ doped B embedded silicon germanium are applicable with modest modification in to the silicon layer 104 in the trenches 71a, 71b. The epitaxy process is easily integrated into current manufacturing processes and is a low cost approach compared to the strained silicon on relaxed silicon germanium approaches. Additionally, unlike methods that use a bulk substrate, the method of the present invention does not depend on misfit dislocations to relax any stress. Rather, the silicon germanium embedded in the source/drain regions of the present invention ensures that no relaxation through plastic flow occurs which is in line with yield control. While the invention has been described in terms of embodiments, those skilled in the art will recognize that the invention can be practiced with modification within the spirit and scope of the appended claims.

What is claimed is:

1. An integrated circuit structure comprising:
  a silicon-on-insulator substrate comprising: a first silicon layer; a buried oxide layer below said first silicon layer; and a second silicon layer below said buried oxide layer; and
  a transistor comprising:
    a gate stack on said first silicon layer;
    source/drain regions comprising: recesses adjacent opposing sides of said gate stack and extending through said first silicon layer and said buried oxide layer into said second silicon layer below a bottom surface of said buried oxide layer; and strained silicon germanium filling said recesses; and
    a channel region in said first silicon layer below said gate stack and between said source/drain regions, wherein said strained silicon germanium imposes a longitudinal stress on said channel region.

2. The structure of claim 1, wherein an atomic concentration of germanium in said strained silicon germanium is between about 10% and 50%.

3. The structure of claim 1, wherein said strained silicon germanium is in-situ doped with boron.

4. The structure of claim 1, wherein said longitudinal stress imposed upon said channel region by said strained silicon germanium is greater than approximately 350 megapascals (MPa).

5. The structure of claim 1, wherein said gate stack comprises a gate dielectric layer on said first silicon layer and a gate conductor layer on said gate dielectric layer, wherein said wafer has a top surface and wherein said strained silicon germanium filling said recesses extends above said top surface such that said gate conductor layer is positioned laterally between said source/drain regions and such that said longitudinal stress on said channel region is further increased.

6. The structure of claim 1, wherein said silicon germanium of said source/drain regions is between approximately 10 nm and 100 nm thick.

7. An integrated circuit structure comprising:
  a silicon-on-insulator substrate comprising: a first silicon layer; a buried oxide layer below said first silicon layer; and a second silicon layer below said buried oxide layer;
  a p-type field effect transistor on said substrate and comprising:
    a first gate stack on said first silicon layer;
    an n-doped silicon portion of said first silicon layer below said first gate stack;
    p-doped source/drain regions comprising: recesses adjacent opposing sides of said first gate stack and extending through said first silicon layer and said buried oxide layer into said second silicon layer below a bottom surface of said buried oxide layer; and strained silicon germanium filling said recesses; and
    a p-channel region in said n-doped silicon portion of said first silicon layer below said first gate stack and between said p-doped source/drain regions, wherein said strained silicon germanium imposes a longitudinal stress on said p-channel region; and
  an n-type field effect transistor on said substrate positioned laterally adjacent to said p-type field effect transistor and comprising:
    a second gate stack;
    a p-doped silicon portion of said first silicon layer below said second gate stack;
    n-doped source/drain regions in said first silicon layer positioned laterally adjacent to said p doped silicon portion; and
    an n-channel region in said p-doped silicon portion of said first silicon layer below said second gate stack and between said n-doped source/drain regions such that a first thickness of said p-doped source/drain regions is greater than a second thickness of said n-doped source/drain regions by more than a third thickness of said buried oxide layer.

8. The structure of claim 7, wherein said substrate further comprises:
  a second buried oxide layer below said second silicon layer; and
  an isolation region between said p-type field effect transistor and said n-type field effect transistor, said isolation region extending through said first silicon layer, said buried oxide layer, and said second silicon layer to said second buried oxide layer so as to isolate said p-type field effect transistor from said n-type field effect transistor, wherein said second buried oxide layer further increases said longitudinal stress imposed upon said p-channel region.

9. The structure of claim 7, wherein an atomic concentration of germanium in said strained silicon germanium is between about 10% and 50%.

10. The structure of claim 7, wherein said strained silicon germanium is in-situ doped with boron.

11. The structure of claim 7, wherein said longitudinal stress imposed upon said p-channel region by said strained silicon germanium is greater than approximately 350 megapascals (MPa).

12. The structure of claim 7, wherein said first gate stack comprises a gate dielectric layer on said first silicon layer and a gate conductor layer on said gate dielectric layer, wherein said wafer has a top surface and wherein said strained silicon germanium filling said recesses extends above said top surface such that said gate conductor layer is positioned laterally between said p-doped source/drain regions and such that said longitudinal stress on said p-channel region is further increased.

13. An integrated circuit transistor structure comprising:
   a silicon-on-insulator substrate comprising: a first silicon layer; a buried oxide layer below said first silicon layer; and a second silicon layer below said buried oxide layer; and
   a transistor comprising:
      a gate stack on said first silicon layer, said gate stack comprising a gate dielectric layer on said first silicon layer and a gate conductor layer on said gate dielectric layer;
      source/drain regions comprising: recesses adjacent opposing sides of said gate stack and extending through said first silicon layer and said buried oxide layer into said second silicon layer below a bottom surface of said buried oxide layer; and strained silicon germanium filling said recesses; and
      a channel region in said first silicon layer below said gate stack and between said source/drain regions, wherein said strained silicon germanium imposes a longitudinal stress on said channel region,
   wherein said wafer has a top surface and wherein said strained silicon germanium filling said recesses extends above said top surface such that said gate conductor layer is positioned laterally between said source/drain regions and such that said longitudinal stress on said channel region is further increased.

14. The structure of claim 13, wherein an atomic concentration of germanium in said strained silicon germanium is between about 10% and 50%.

15. The structure of claim 13, wherein said strained silicon germanium is in-situ doped with boron.

16. The structure of claim 13, wherein said longitudinal stress imposed upon said channel region by said strained silicon germanium is greater than approximately 350 megapascals (MPa).

17. The structure of claim 13, wherein said silicon germanium of said source/drain regions is between approximately 10 nm and 100 nm thick.

* * * * *